United States Patent [19]
Breunsbach et al.

[11] Patent Number: 5,201,958
[45] Date of Patent: Apr. 13, 1993

[54] CLOSED-LOOP DUAL-CYCLE PRINTED CIRCUIT BOARD CLEANING APPARATUS AND METHOD

[75] Inventors: Rex Breunsbach, Clackamas; Paul M. Austen, Milwaukie, both of Oreg.

[73] Assignee: Electronic Controls Design, Inc., Portland, Oreg.

[21] Appl. No.: 789,964

[22] Filed: Nov. 12, 1991

[51] Int. Cl.⁵ ............................. B08B 3/12; B08B 5/00
[52] U.S. Cl. .................................... 134/1; 134/10;
134/26; 134/36; 134/95.1; 134/98.1; 134/99.1;
134/186; 134/902
[58] Field of Search ............... 134/1, 10, 26, 36, 95, 134/184, 186, 902, 95.1, 99.1, 98.1

[56]         References Cited
         U.S. PATENT DOCUMENTS

| | | | |
|---|---|---|---|
| 3,489,608 | 1/1970 | Jacobs et al. | 134/25 |
| 4,023,931 | 5/1977 | Wolfgram | 23/230 |
| 4,132,567 | 1/1979 | Blackwood | 134/1 |
| 4,178,188 | 12/1979 | Dussault et al. | 134/1 |
| 4,409,999 | 10/1983 | Pedziwiatr | 134/184 |
| 4,589,926 | 5/1986 | Holmstrand | 134/6 |
| 4,640,719 | 2/1987 | Hayes et al. | 134/40 |
| 4,643,774 | 2/1987 | Kishida et al. | 134/1 |
| 4,731,154 | 3/1988 | Hazlitt et al. | 156/626 |
| 4,740,247 | 4/1988 | Hayes et al. | 134/42 |
| 4,740,249 | 4/1988 | McConnell | 134/25.4 |
| 4,749,440 | 6/1988 | Blackwood et al. | 156/646 |
| 4,778,532 | 10/1988 | McConnell et al. | 134/10 |
| 4,784,169 | 11/1988 | Striedieck | 134/111 |
| 4,827,867 | 5/1989 | Takei et al. | 118/64 |
| 4,852,516 | 8/1989 | Rubin et al. | 118/715 |
| 4,871,417 | 10/1989 | Nishizawa et al. | 156/640 |
| 4,902,350 | 2/1990 | Steck | 134/1 |
| 4,971,920 | 11/1990 | Miyashita et al. | 134/1 |
| 4,980,300 | 12/1990 | Miyashita et al. | 134/1 |
| 5,027,841 | 7/1991 | Breunsbach et al. | 134/95 |

Primary Examiner—Theodore Morris
Assistant Examiner—Saeed T. Chaudhry
Attorney, Agent, or Firm—Klarquist, Sparkman, Campbell, Leigh & Whinston

[57]         ABSTRACT

A cleaning apparatus and method for washing and rinsing electronic assemblies. The apparatus includes a single closable chamber for containing a single tank with attached ultrasonic transducers. Separate wash and rinse fluid circuits each are arranged to fill the tank, to drain fluid from the tank, and to recondition the fluid for reuse. To permit the safe use of combustible solvents, an inert gas purge system evacuates oxygen and combustible vapors from areas with potential electrical ignition sources.

48 Claims, 2 Drawing Sheets

CLOSED-LOOP DUAL-CYCLE PRINTED CIRCUIT BOARD CLEANING APPARATUS AND METHOD

FIELD OF THE INVENTION

This invention relates to a method and apparatus for cleaning printed circuit boards (PCBs) and other electronic assemblies. More particularly, the invention relates to a PCB cleaning system that recycles cleaning fluids employed.

BACKGROUND OF THE ART

During assembly of components on printed circuit boards, soldering fluxes are applied to the board material to facilitate soldering. After soldering, remaining flux residue must be removed. The flux chemistry determines what fluid is suitable for removing the flux. Unlike some fluxes, rosin-based fluxes are not removable with a water wash, and require more aggressive solvents that have environmental disadvantages. Such solvents generate flammable and environmentally undesirable vapors that must be safely contained, and require costly disposal methods because they cannot be drained into conventional sewer systems.

A batch cleaning system using such combustible solvents is disclosed in U.S. Pat. No. 5,027,841 to Breunsbach et al. This system is a closed loop system using only solvent to wash the PCBs in a sealed chamber that is purged with inert gas before it is opened. In the closed loop system, solvent is reused and recycled until its useful properties are exhausted. Solvent is sprayed onto the boards to mechanically dislodge and dissolve contaminants. After the PCBs are cleaned, they must be removed from the chamber and inserted in a separate apparatus for rinsing the remaining solvent off the boards. Although the inert gas purge is sufficient to eliminate any fire or explosion hazard, some solvent vapor escapes to the environment as the PCBs are transferred to the rinse apparatus.

A printed circuit board cleaning apparatus that uses a first wash fluid and a second rinse fluid in a single chamber is shown in U.S. patent application Ser. No. 07/715,441, filed Jun. 14, 1991, by Breunsbach et al. In this system, a saponifier solution wash is sprayed onto the PCBs and then drained from the chamber. A similar water rinse follows. Finally, a water and alcohol solution is sprayed onto the boards to be subsequently tested to determine cleaning effectiveness. This system does not, however, recycle or reuse the saponifier wash fluid or the rinse fluid. Only the cleanliness test solution is recycled for reuse.

SUMMARY OF THE INVENTION

The primary objects of the invention are to provide:

1. A printed circuit board cleaning apparatus having at least two separate cleaning cycles using cleaning fluids from separate sources, and including an ultrasonic generator for agitating the fluid.

2. A printed circuit board cleaning apparatus having an ultrasonic generator for agitating cleaning fluid, and which apparatus recycles the cleaning fluid.

3. A printed circuit board cleaning apparatus having at least two separate cleaning cycles using cleaning fluids from separate sources, and which recycles the cleaning fluid to avoid discharging a substantial quantity thereof.

4. A printed circuit board cleaning apparatus having a single receptacle for holding the boards for a solvent fluid wash and a separate water rinse.

According to the present invention, the primary objects are achieved by providing a printed circuit board cleaning apparatus having two separate wash and rinse fluid circuits, each separate and in communication with a tank for immersing boards to be cleaned. Each fluid circuit collects and filters drained fluid for reuse. The rinse fluid is also further purified. An array of ultrasonic transducers connected to the tank facilitates thorough and rapid cleaning. An inert gas purge system eliminates flammable vapors and oxygen from areas of the apparatus where there are potential electrical ignition sources.

The foregoing additional features and advantages of the present invention will be more readily apparent from the following detailed description which proceeds with reference to the accompanying drawings.

DETAILED DESCRIPTION OF A PREFERRED EMBODIMENT

Figure 1:
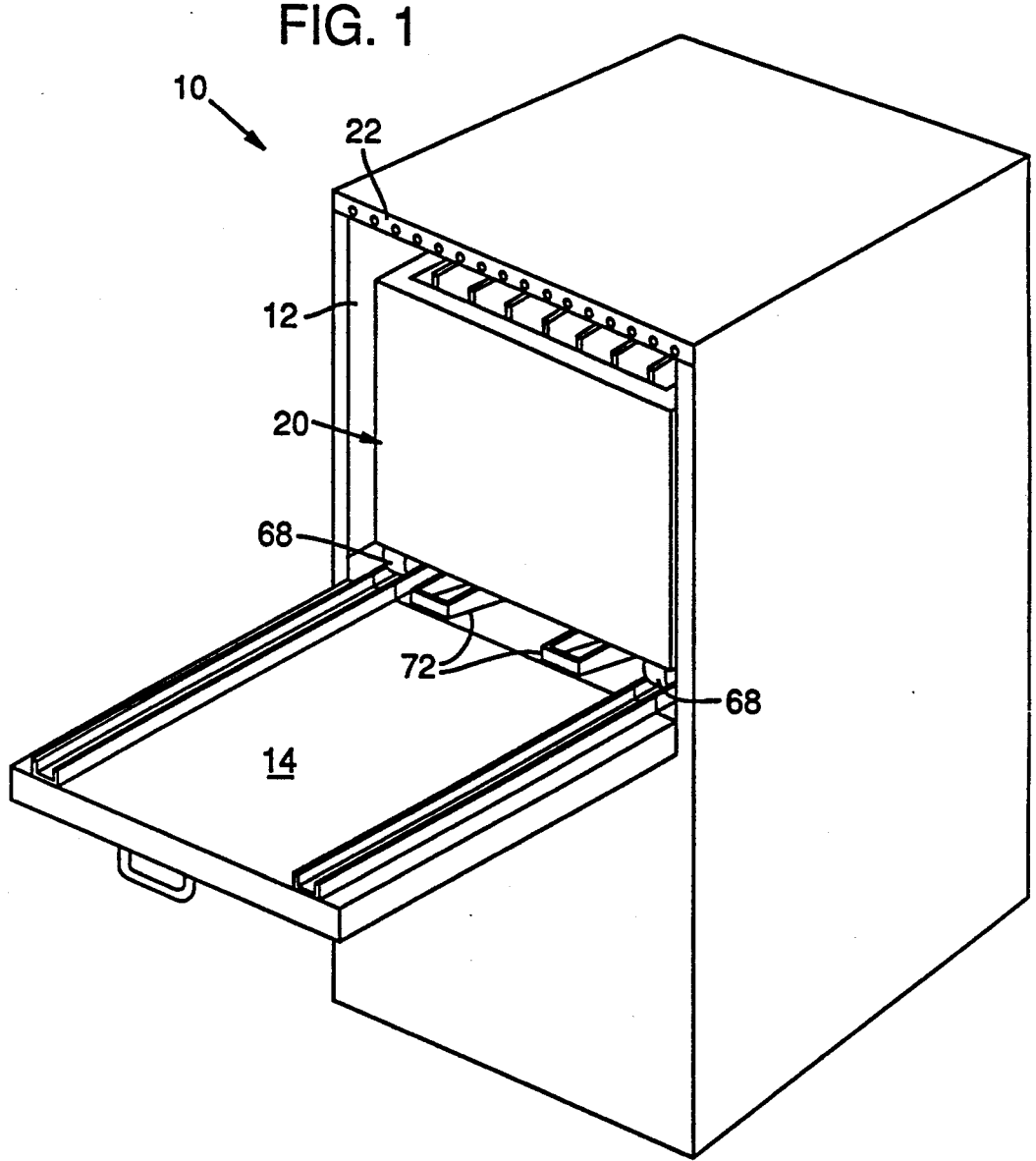
FIG. 1 is a perspective view of a printed circuit board cleaning apparatus according to the present invention.

FIG. 1 shows an electronic assembly cleaning apparatus 10 with an upper portion defining a forwardly open chamber 12 that is closable by a hinged door 14. The door is hinged at its lower edge to open perpendicularly away from the front of the apparatus 10. A wheeled carriage 20 resides in the chamber 12 and may be rolled out of the chamber 12 onto the open door 14. A perforated fume ventilation plenum 22 is attached to the chamber 12 at the upper perimeter of the opening to draw in fume vapors that would otherwise be released when the door is opened.

Figure 2:
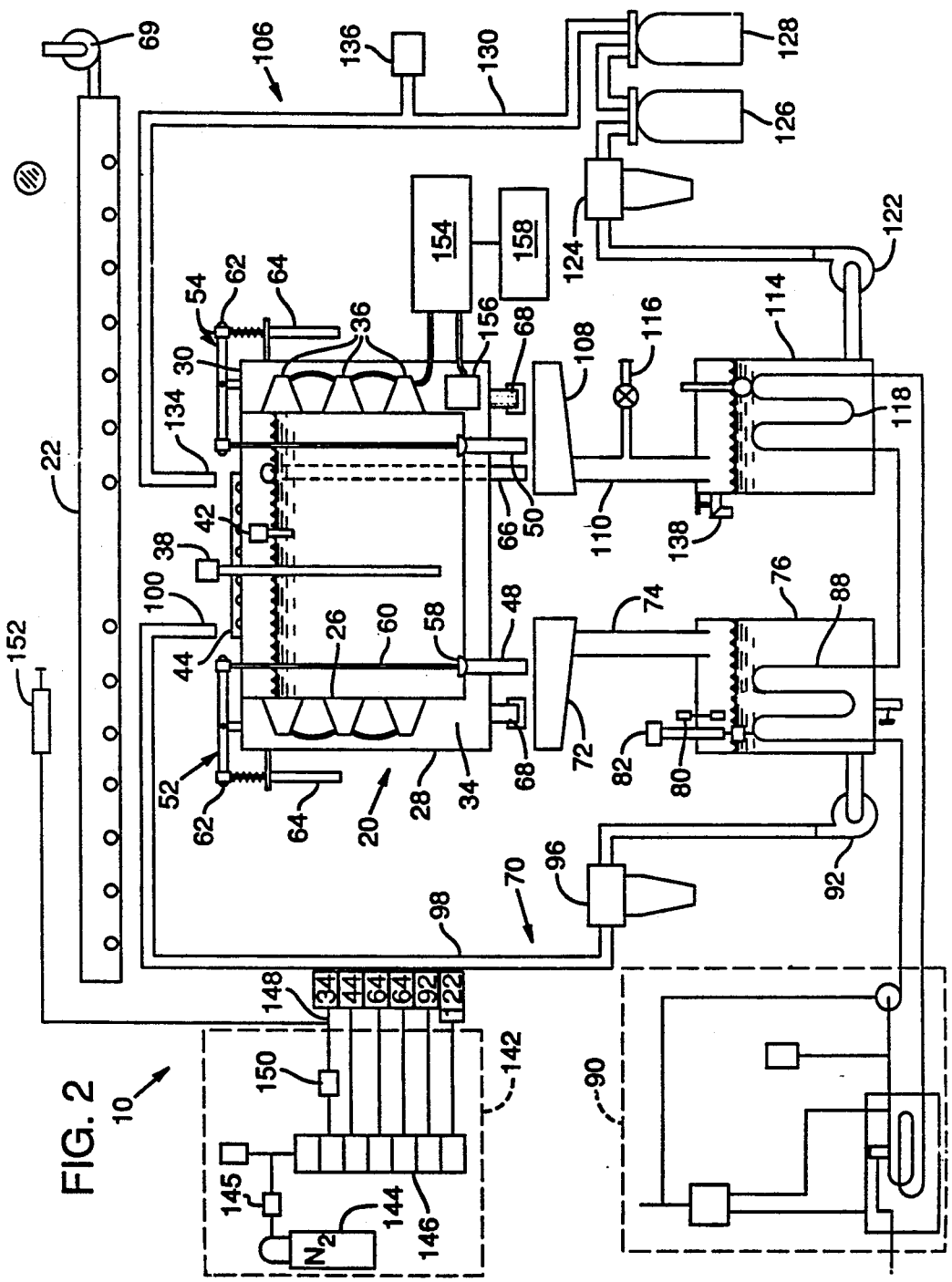
FIG. 2 is a schematic diagram of the apparatus of FIG. 1, showing the functional components thereof.

As shown in FIG. 2, the carriage 20 includes an inner cleaning tank 26 and an outer vessel 28. The upper rim edges of the tank 26 and outer vessel 28 are sealed together with an upper vessel panel 30 to define an enclosed jacket 34 surrounding the tank 26 on all its sides and bottom, and contained within the outer vessel 28.

An array of ultrasonic transducers 36 is positioned within the jacket 3 and attached to the exterior of the tank 26. In a preferred embodiment, a conventional transducer such as that provided by Ney Company of Hartford, Conn., is suitable for providing 10 to 100 watts per gallon.

The tank carriage 20 further includes a sump fill level sensor 38 for indicating the fluid level in the tank. A sump sensor 42 resides in the tank to be in contact with fluid contained therein to determine when the assemblies are cleaned. A sparge 44 is a vessel connected to a source of gas such as nitrogen and includes a plurality of apertures for expelling the gas onto the inner surface of the tank 26 to blow remaining fluid droplets off the walls of the tank to facilitate drainage. A sparge may alternatively be provided in the bottom of the tank to laterally direct fluid across the floor of the tank 26.

The lower portion of the carriage 20 defines a solvent drain 48 and a rinse drain 50 on opposite sides of the tank 26 at the rear portion thereof. The drains pass downward out of the tank 26 and through the jacket 34 and outer vessel 28 to provide fluid communication between the interior of the tank and the area below the carriage 20. The drains are each sealed from the jacket area 34 to maintain an environmentally sealed jacket.

A solvent drain plug assembly 52 and a rinse drain plug assembly 54 are attached to the carriage 20 to provide selectable opening and closing of the respective solvent drain 48 and rinse drain 50. Each drain plug assembly includes a plug 58 suspended by a rod 60 above the respective drain by a lifting mechanism 62 controlled by a gas piston 64.

The carriage 20 further includes a water overflow drain 66 in communication at an upper end with the interior of the tank 26 at an upper portion thereof, and open at a lower end substantially adjacent the outlet of the rinse drain 50. The carriage 20 rests on a set of rollers 68 to permit it to be rolled forwardly out of the chamber 12 when the door 14 is open, as shown in FIG. 1. The plenum 22 is positioned above the door, and includes an exhaust sensor 69. The plenum is connectable to any exhaust fan (not shown).

A solvent fluid circuit 70 is included in the cleaning apparatus 10 to collect fluid from the solvent drain 48, to store, test and condition the fluid for recycling. A solvent collection trough 72 is an elongated receptacle positioned beneath the solvent drain 48 for collecting fluid drained from the tank 26. Because of the rearward positioning of the solvent drain 48 on the carriage 20, the trough 72 effectively collects drained fluid regardless of whether the carriage 20 is fully installed in the chamber 12, fully rolled out onto the door 14, or any position in between. The trough 72 drains through a conduit 74 into a solvent holding tank 76 having a volume comparable to the cleaning tank 26. The holding tank 76 includes a level sensor 80 and a temperature sensor 82. A heater coil 88 within the tank circulates heated fluid selectively provided by a heater 90 in response to a signal from the temperature sensor 82 to provide a thermostatically controlled solvent temperature.

To fill the cleaning tank 26 with solvent, a solvent fill pump 92 draws fluid from the solvent holding tank and sends it through a particle filter 96, and thereafter through a conduit 98 that terminates in a solvent outlet 100 positioned in the chamber 12 directly above the upwardly open tank 26. The solvent fill pump 92 is driven by an external source of pressurized air. This avoids placing the ignition sources found in conventional electric motors in proximity with potentially flammable solvent. The pump 92 may alternatively be driven by an external source of pressurized inert gas such as nitrogen to further avoid introduction of oxygen.

A rinse fluid circuit 106 circulates rinse fluid, typically water, through a system that is similar to, but entirely independent of the solvent fluid circuit, except that both circuits communicate with the cleaning tank 26. A rinse trough 108 similar to the solvent trough 72 is positioned below the rinse drain 50 and overflow drain 56 to catch fluid emitted therefrom. A conduit 110 empties from the trough 108 into a rinse holding tank 114. A tap water source 116 is connected to the conduit 110 to add additional water to the holding tank 114 as needed when the water is depleted due to evaporation and dragout losses as wet boards are removed. A heater coil 118 passes through the holding tank 114 to heat the fluid contained therein by circulating heated fluid provided by the heater 90. A rinse fill pump 122 similar to the solvent fill pump 92 pumps the rinse fluid through a particle filter 124, a carbon purifier 126 and a deionizer 128. The rinse fluid is thereafter transmitted through a conduit 130 that terminates in a rinse fluid outlet 134 positioned above the tank 26. A rinse fluid conductivity tester 136 is positioned in communication with the conduit 130 after the filters and purifiers to indicate when the rinse filters are sufficiently contaminated to require replacement. The rinse holding tank 114 may optionally include a solvent outlet valve 138 for decanting any solvent that remains floating on the surface of the rinse fluid in the holding tank. The outlet may include a floating intake (not shown) and a receptacle (not shown) for collecting any decanted solvent.

An inert gas supply system 142 provides inert gas such as nitrogen to the various system components requiring a gas supply. A nitrogen tank 144 is connected through a regulator 145 to a manifold 146 with a plurality of outlets. A purge line 148 including a purge flow rate meter 150 communicates with the carriage jacket 34 to evacuate any oxygen or solvent vapors from the jacket before the electrically-powered ultrasonic transducers 36 are activated. A door lock 152 connected to the purge line prevents opening of the door while a purge is in process. The manifold further includes connections to the sparge 44, the solvent and rinse drain lifting mechanisms 64, and the solvent and rinse fill pumps 92, 122. Alternatively, the solvent and rinse fill pumps may be powered by compressed air to conserve the nitrogen supply, as discussed above.

The ultrasonic transducers 36 are electrically powered by an ultrasonic power source 154 that includes a safety interlock purge sensor 156 mounted inside the jacket 34 to prevent operation of the ultrasonic system when the jacket is inadequately purged. The ultrasonic power source 154 may be controlled by a NeyproSONIK model process control ultrasonic generator 158 mounted in the cabinet of the cleaning apparatus 10. Alternatively, the ultrasonic system may be controlled by an external microprocessor controller (not shown). If the electrical process controller 158 is mounted in the cleaning apparatus 10, a purge line (not shown) is connected to provide a selective flow of nitrogen gas through the process controller 158 to evacuate oxygen and any accumulated solvent vapors to avoid ignition by the electrical contacts and switches contained therein.

Having illustrated and described the principles of my invention by what is presently a preferred embodiment, it should be apparent to those skilled in the art that the illustrated embodiment may be modified without departing from such principles. For instance, a conventional agitation system may be substituted for the ultrasonic agitation, and alternative fluids may be substituted for the semi-aqueous solvent and water rinse. I claim as my invention not only the illustrated embodiments but all such modifications, variations and equivalents thereof which come within the true spirit and scope of the following claims.

I claim:

1. An apparatus for cleaning electronic assemblies comprising:

a tank for receiving the assemblies for cleaning, a first fluid source in communication with the tank for filling the tank with a first cleaning fluid to immerse the assemblies, a first fluid drain aperture defined in the tank for draining the first cleaning fluid from the tank, a second fluid source in communication with the tank for filling the tank with a second cleaning fluid to immerse the assemblies, a second fluid drain aperture separate from the first fluid drain aperture, and defined in the tank for draining the second cleaning fluid from the tank, a first fluid drain conduit in communication with the tank at the first fluid drain aperture, a second fluid drain conduit in communication with the tank at the second fluid drain aperture, shutoff means for preventing the first fluid from entering the second conduit and the second fluid from entering the first conduit, and an ultrasonic generator operably connected to the tank for transmitting ultrasonic energy through the fluid therein to facilitate cleaning the assemblies.

2. The apparatus of claim 1 wherein the first cleaning fluid comprises a wash fluid and the second cleaning fluid comprises a rinse fluid.

3. The apparatus of claim 1 wherein the first fluid drain conduit communicates with the first fluid source such that the first cleaning fluid is recycled.

4. The apparatus of claim 1 wherein the second fluid drain conduit communicates with the second fluid source such that the second cleaning fluid is recycled.

5. The apparatus of claim 1 wherein the first cleaning fluid and second cleaning fluids are different fluids.

6. The apparatus of claim 5 wherein the first cleaning fluid comprises an aqueous solvent and the second cleaning fluid comprises water.

7. The apparatus of claim 5 wherein the first cleaning fluid comprises a semi-aqueous solvent and the second cleaning fluid comprises water.

8. The apparatus of claim 7 including a chamber in proximity with the tank, and a source of inert gas in communication with the chamber to purge flammable vapors therefrom.

9. The apparatus of claim 5 wherein the second cleaning fluid comprises water.

10. The apparatus of claim 5 wherein the second cleaning fluid comprises a mixture of alcohol and water.

11. The apparatus of claim 1 wherein the first fluid drain conduit includes a first catch basin positioned below the first drain aperture, and the second fluid drain conduit includes a second catch basin positioned below the second drain aperture.

12. The apparatus of claim 11 wherein the tank has a front side and a rear sided and wherein the drain apertures are defined near the rear side of the tank such that when the tank is slid toward its front side for loading and unloading, each drain aperture remains above the respective catch basin to collect any fluid flowing from the drain aperture.

13. The apparatus of claim 1 wherein the tank includes a jacket enclosed to prevent flammable vapors from entering the jacket.

14. The apparatus of claim 13 including an ultrasonic transducer contained within the jacket for transmitting ultrasonic energy into the tank.

15. The apparatus of claim 13 including an inert gas supply system for providing inert gas to the jacket to prevent accumulation of flammable vapors or oxygen in the jacket.

16. The apparatus of claim 1 including a sparge for directing gas into the tank to blow fluid droplets off the tank and the assemblies to facilitate complete draining.

17. The apparatus of claim 1 wherein the shutoff means comprises a plug operable to selectively close the drain aperture.

18. The apparatus of claim 1 wherein the shutoff means comprises a valve operable to selectively close the drain aperture.

19. The apparatus of claim 1 wherein the drain apertures are defined in the bottom of the tank such that the tank may be fully emptied when one of the apertures is open.

20. The apparatus of claim 1 including testing means for determining the condition of the fluid.

21. The apparatus of claim 1 including fluid conditioning means for purifying the fluid to facilitate prolonged recycling.

22. The apparatus of claim 1 wherein the tank includes rollers for lateral sliding of the tank to facilitate loading.

23. An apparatus for cleaning electronic assemblies comprising:

a tank for receiving the assemblies for cleaning and defining a first fluid drain aperture and a separate second fluid drain aperture, a first fluid source in communication with the tank for filling the tank with a first cleaning fluid to immerse the assemblies, a first fluid drain in communication with the tank at the first aperture for draining the first cleaning fluid from the tank, a first fluid circuit communicating between the first fluid drain and the first fluid source for recycling the first fluid, a second fluid source separate from the first fluid source in communication with the tank for filling the tank with a second fluid to immerse the assemblies, a second fluid drain in communication with the tank at the second aperture for draining the second fluid from the tank, and a second fluid circuit communicating between the second fluid drain and the second fluid source for recycling the second fluid, and an ultrasonic generator operably connected to the tank for transmitting ultrasonic energy through the fluid therein to facilitate cleaning the assemblies such that each fluid drain, each circuit and each source is dedicated to a single fluid type whereby the tank is the only element that normally contacts both fluid types.

24. The apparatus of claim 23 wherein each fluid source comprises a fluid reservoir and a fluid pump.

25. An apparatus for cleaning electronic assemblies comprising:

a tank for receiving the assemblies for cleaning, a first fluid source in communication with the tank for filling the tank with a first cleaning fluid to immerse the assemblies, a first fluid drain in communication with the tank for draining the first cleaning fluid from the tank, a second fluid source in communication with the tank for filling the tank with a second cleaning fluid to immerse the assemblies, a second fluid drain separate from the first fluid drain in communication with the tank for draining the second cleaning fluid from the tank, a first fluid circuit communicating between the first fluid drain and the first fluid source for recycling the first fluid, a second fluid circuit independent of the first fluid circuit for communicating between the second fluid drain and the second fluid source for recycling the second fluid, and shutoff means for selectably closing each fluid drain such that the first fluid does not flow through the second drain, and the second fluid does not flow through the first drain.

26. The apparatus of claim 23 wherein the first cleaning fluid comprises a wash fluid and the second cleaning fluid comprises a rinse fluid.

27. The apparatus of claim 25 wherein the first cleaning fluid comprises a semi-aqueous solvent.

28. The apparatus of claim 27 including a chamber in proximity with the tank, and a source of inert gas in communication with the chamber to purge flammable vapors therefrom.

29. The apparatus of claim 25 wherein the first cleaning fluid comprises an aqueous solvent.

30. The apparatus of claim 25 wherein the first cleaning fluid comprises water.

31. The apparatus of claim 25 wherein the first fluid circuit includes a first catch basin positioned below the first fluid drain and the second fluid circuit includes a second catch basin positioned below the second fluid drain.

32. An apparatus for cleaning electronic assemblies comprising:

a tank having an interior suitable for receiving the assemblies, a pair of separate, selectably openable drains defined in the tank, each drain connected with a separate fluid circuit for recycling fluid drained from the tank, and a sparge positioned adjacent to the tank for blowing gas into the tank interior to blow fluid droplets toward the drains to minimize the quantity of fluid remaining on the assemblies and within the tank, such that when different fluids are alternately employed within the tank, cross contamination of subsequently employed fluid by remaining droplets is minimized.

33. An apparatus for cleaning electronic assemblies comprising:

a tank for receiving the assemblies, a jacket attached to the tank and defining therewith an enclosed space, and an ultrasonic transducer positioned within the jacket and connected to the tank for transmission of ultrasonic energy there to, such that flammable vapors may not enter the enclosed space to hazardously encounter the transducer.

34. The apparatus of claim 33 including an inert gas supply system in communication with the jacket for displacing flammable gas within the jacket such that the ultrasonic transducer may be operated while flammable fluid is in the tank without risk of combustion.

35. A method of cleaning electronic assemblies comprising the steps:

placing the assemblies in a tank, pumping a wash fluid into the tank from a wash fluid source, directing ultrasonic energy to the tank, opening a first drain for draining the wash fluid from the tank, pumping a rinse fluid into the tank from a rinse fluid source separate from the wash fluid source, and opening a second drain for draining the rinse fluid from the tank, such that the assemblies are fully washed and rinsed while in a single tank and the fluids employed may be separately recovered for reuse with minimal cross-contamination.

36. The method of claim 35 wherein the step of draining the wash fluid includes collecting the wash fluid for reuse.

37. The method of claim 35 wherein the step of draining the rinse fluid includes collecting the rinse fluid for reuse.

38. The method of claim 37 including separating wash fluid contaminants from the rinse fluid.

39. The method of claim 37 including filtering the rinse fluid.

40. The method of claim 35 including testing the rinse fluid to evaluate its suitability for reuse.

41. The method of claim 35 wherein the wash fluid is a semi-aqueous solvent.

42. A method of cleaning electronic assemblies comprising the steps:

placing the assemblies in a tank, pumping a wash fluid from a wash fluid reservoir into the tank, draining the wash fluid from the tank via a first drain to the wash fluid reservoir, pumping a rinse fluid from a rinse fluid reservoir separate from the wash fluid reservoir and into the tank, and draining the rinse fluid from the tank via a second drain separate from the first drain to the rinse fluid reservoir, such that the assemblies are cleaned while in a single tank, and the cleaning fluids are recycled.

43. The method of claim 42 including testing the rinse fluid to evaluate its suitability for reuse.

44. The method of claim 42 including separating wash fluid contaminants from the rinse fluid.

45. The method of claim 42 including filtering the rinse fluid.

46. The method of claim 42 including the step of ultrasonically agitating the wash fluid.

47. The method of claim 42 including the step of spraying the wash fluid onto the assemblies.

48. An apparatus for cleaning electronic assemblies comprising:

a tank for receiving the assemblies, an ultrasonic transducer attached to the tank, a housing containing the transducer and connected to a source of inert gas such that the housing may be purged to safely permit use of flammable solvents in the tank, a pair of separate, closed-loop fluid circuits, each for circulating a separate volume of fluid, each in communication with the tank and including shutoff means for preventing fluid in the first circuit from entering the second circuit, and fluid in the second circuit from entering the first circuit, and a sparge having gas outlets directed into the tank for blowing excess fluid droplets from the tank and assemblies to reduce fluid waste and cross contamination.

* * * * *